United States Patent [19]

Arsenault

[11] 3,984,692

[45] Oct. 5, 1976

[54] IONIZATION APPARATUS AND METHOD FOR MASS SPECTROMETRY

[75] Inventor: Guy P. Arsenault, Lexington, Mass.

[73] Assignee: Massachusetts Institute of Technology, Cambridge, Mass.

[22] Filed: Jan. 4, 1972

[21] Appl. No.: 215,373

[52] U.S. Cl. .................................250/423 R; 250/427; 250/41.9 SB

[51] Int. Cl. ..................................................H01J 37/08

[58] Field of Search ................ 250/41.9 G, 41.9 SB, 250/41.9 SE, 41.9 S; 313/63, 231

[56] References Cited

UNITED STATES PATENTS

| | | | |
|---|---|---|---|
| 3,155,708 | 11/1964 | Chupp et al. | 260/981 |
| 3,231,735 | 1/1966 | Peters | 250/41.9 SB |
| 3,405,263 | 10/1968 | Wanless et al. | 250/41.9 SE |
| 3,419,620 | 12/1968 | Becher et al. | 71/87 |
| 3,505,518 | 4/1970 | Mitani | 313/231 |
| 3,536,789 | 10/1970 | Lorenz et al. | 260/940 |
| 3,551,529 | 12/1970 | Kaugars | 260/566 AE |
| 3,621,240 | 11/1971 | Cohen et al. | 250/41.9 SE |
| 3,626,180 | 12/1971 | Carroll et al. | 250/41.9 TF |

FOREIGN PATENTS OR APPLICATIONS

| | | | |
|---|---|---|---|
| 710,649 | 8/1968 | Belgium | 260/453 R |

*Primary Examiner*—James W. Lawrence
*Assistant Examiner*—B. C. Anderson
*Attorney, Agent, or Firm*—Arthur A. Smith, Jr.

[57] ABSTRACT

Ionizing gaseous substances (e.g., for mass spectral analysis) by passing the neutral gaseous substances sequentially through a chemical ionization (CI) zone and an electron impact ionization (EI) zone and impelling gaseous ions formed in one or both of the zones to a mass spectrometer. CI, EI, simultaneous EI—EI, and closely alternating CI and EI spectra are obtainable.

24 Claims, 3 Drawing Figures

IONIZATION APPARATUS AND METHOD FOR MASS SPECTROMETRY

The invention herein described in the course of work performed under grant No. 5 PO 7 RR00317 from the Department of Health, Education and Welfare.

FIELD OF INVENTION

This invention relates to mass spectrometry.

BACKGROUND OF INVENTION

Within the past few years there has been added to the electron impact ionization (EI) mode of ionizing substances in the gaseous state for mass spectrometric analysis, another mode of ionizing, called chemical ionization (CI). Whereas in electron impact ionization the substance under investigation is bombarded with electrons, in chemical ionization the substance is reacted with a known pre-selected set of reactant ions. In practice, chemical ionization is achieved by forming primary ions in the ion source by electron impact ionization of a reactant gas at pressures greatly in excess of those used in electron impact ionization of substances (e.g., about 1 Torr for CI vs. about $10^{-4}$ Torr or less for EI). The primary ions thereby formed undergo ion-molecule reactions with neutral reactant gas molecules so as to produce reactant ions. Finally, chemical ionization of the substance under investigation occurs in the same ion source by ion-molecule reactions of the substance with the reactant ions. Of course, all of these three steps occur substantially simultaneously and continually in the CI source. In general, chemical ionization mass spectra have fewer ions and more intense high mass ions than electron impact mass spectra and the two ionization techniques are highly desirable complementary analytical tools. A comparison and further analysis of these techniques may be found in applicant's article "Chemical Ionization Mass Spectrometry," appearing as Chapter 31 of "Biochemical Application of Mass Spectrometry" edited by G. R. Waller, Wiley-Interscience Publishers, New York, N.Y., 1971.

Because of the complementary nature of the two ionization techniques, attempts have been made to provide a single source capable of both chemical and electron impact ionization at consecutive times, with the reactant gas pressure being the determinant of whether the source is operating in a CI or an EI mode. However, because the CI pressures are considerably above the typical pressure in the analyzer region of the mass spectrometer (usually less than $10^{-5}$ Torr), a gas-tight ion source region must be provided, requiring that the electron entrance and ion exit apertures be very small. This reduces significantly (by roughly an order of magnitude) the sensitivity of the source in the electron impact mode of operation, simply due to the decrease in the number of electrons entering the source through the narrow electron entrance aperture and the decrease in the number of ions leaving the source through the narrow ion exit aperture.

Moreover, when the ion source is fed from the outlet of a gas chromatographic column, an analytical technique gaining much importance wherein, in effect, the mass spectrometer becomes the detector for gas chromatography, additional problems of the combined CI-EI source surface. For chemical ionization, the technique is simple since the effluent from the gas chromatographic column may be fed directly to the ion source of the mass spectrometer, with the carrier gas of the effluent serving as reactant gas in the ion source.

However, if the effluent is to be subjected instead to electron-impact ionization, a splitter or a separator must be provided at the gas chromatography—mass spectrometer interface, thereby complicating an otherwise simple interface. An alternative is to reduce the effluent flow rate drastically to keep the pressure in the ion source at the level ($10^{-4}$ Torr and Lower) required for electron impact ionization. Such flow rate changes make difficult correlation between the CI and EI spectra of the effluent. Moreover, because of the large disparity in pressures required for the EI and CI modes, switchover in the middle of a gas chromatographic peak (typically of 15 seconds duration at half height) is not possible. Thus separate time-separated runs are needed on duplicate sample injections and hence, despite all efforts at identity and ignoring the considerable time loss in such duplicate injections, this leads, minimally, to a great deal of effort in correlation of the EI and CI spectra.

SUMMARY OF INVENTION

It is an object of this invention to provide an improved ion source, useful with conventional mass spectrometers, capable of subjecting a gaseous substance to either electron impact or chemical ionization or both.

Another object is to provide simultaneous or closely alternating CI and EI mass spectra of substances.

Another object is to provide an ionization region for achieving both electron-impact and chemical ionization of the effluent of a gas chromatograph for mass spectrometric analysis, and, particularly, for achieving both kinds of ionization within a time interval less than that required for a peak of the gas chromatographic effluent to traverse the ionization region.

The invention features apparatus for ionizing gaseous substances, comprising a reactant gas and a substance to be analyzed, for analysis in a mass spectrometer comprising: a first ionization zone constructed to contain the gaseous substances at chemical ionizatin pressures and comprising a first ionizing means for ionizing the substance to be analyzed in the first zone; a second separate ionization zone constructed to contain the gaseous substances at an electron impact ionization pressure (below the pressure in the first ionization zone) and comprising second ionizing means comprising a source of electrons for ionizing gaseous substances in the second zone; flow means for directing the neutral gaseous substances in a path sequentially through the first and second ionization zones; and, means for directing and impelling the gaseous ions formed in the first zone or the second zone or both in a path toward the mass spectrometer.

In preferred embodiments, a pressure differential between the first and second ionization zones is maintained by providing a small aperture for gas flow from the first into the second zone, so that neutral gases are directed sequentially through the zones.

In one preferred embodiment, the gaseous ions formed are impelled by electrical means, namely by applying suitable potentials along the desired path to impel the ions to the mass spectrometer. The electrical potentials given throughout are those to be used for studying positive ions. Where negative ions are to be studied the same potentials are suitable, but with their polarities reversed. Where the ion path is also to be sequentially through the two zones, the numerical value electrical potentials applied to the two zones is chosen so as to provide a decreasingly positive potential in the desired ion-flow direction. An additional potential is applied to an electroconductive ion-permeable screen which is located between the zones. This potential is negative with respect to the potential at the first zone to impel positive ions formed in the first zone past it and into the second zone.

The invention is particularly useful for mass spectral analysis of the effluent of a gas chromatograph. Each component of the gas chromatographic effluent stream may be (a) chemically ionized or (b) electron-impact ionized or (c) both chemically and electron-impact ionized, either to obtain sequentially and alternatively chemical ionization and electron impact ionization (i.e., to obtain both spectra within about 30 seconds total elapsed time, including switchover, or within the time width at half height of the peak of a gas chromatographically separated substance emerging in the effluent from a gas chromatograph) or to obtain simultaneous chemical and electron-impact ionization mass spectra.

BRIEF DESCRIPTION OF THE DRAWINGS

Other objects, features and advantages will be apparent to one skilled in the art from the following description of a preferred embodiment of the invention, taken together with the attached drawings thereof, in which.

DESCRIPTION OF PARTICULAR EMBODIMENT

Figure 1:
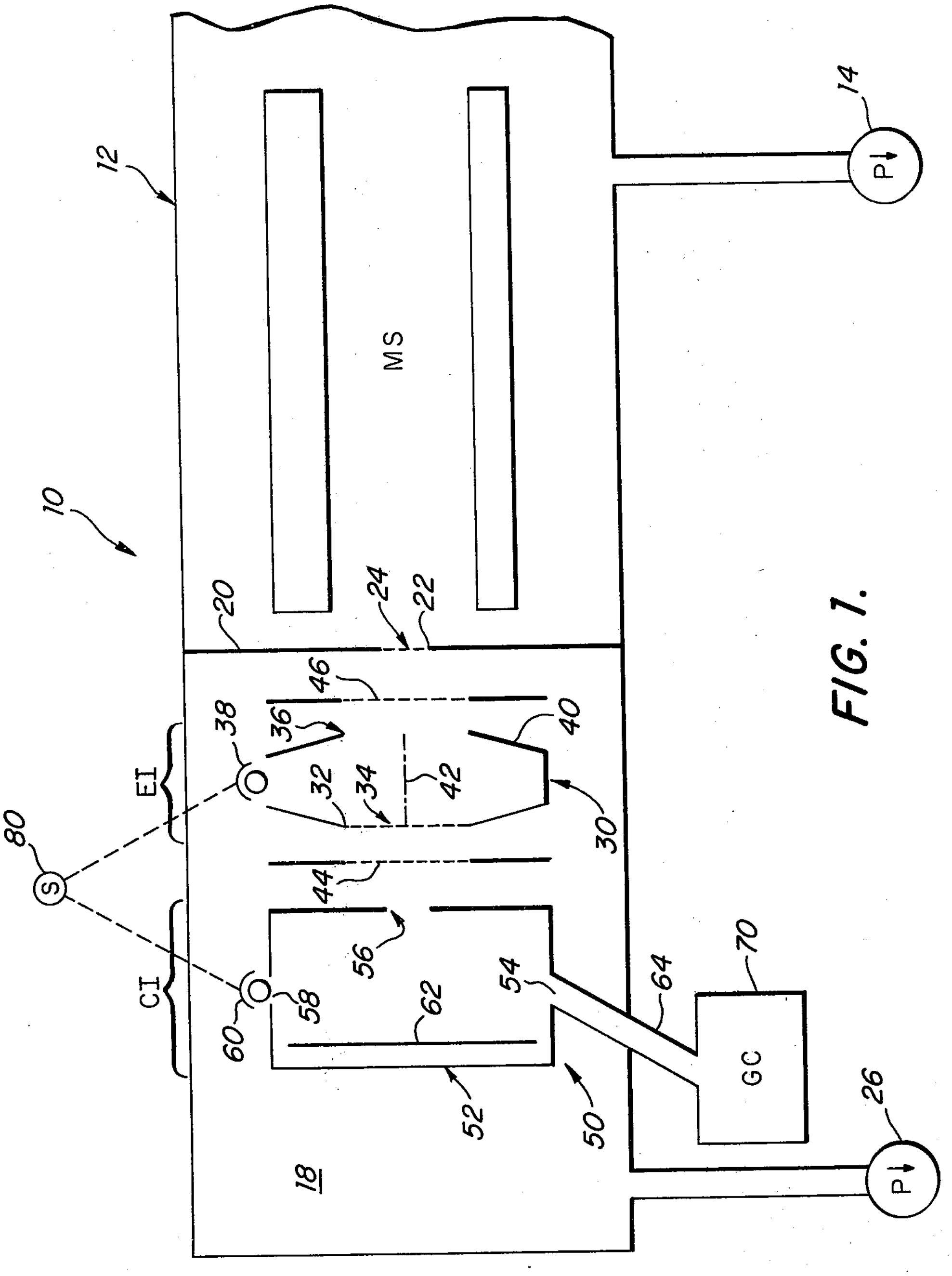
FIG. 1 is a diagrammatic view of apparatus constructed in accordance with the present invention.

FIG. 1 shows a portion of a mass spectrometer 10, for illustrative purposes, a QUAD 300 (Electronic Associates, Inc.) Quadrupole Mass Filter mass spectrometer, having a quadrupole mass filter region 12 and a diffusion pumping system 14, which maintains a pressure in the filter region 12 of about, e.g., $3 \times 10^{-5}$ Torr. Filter region 12 is separated from vacuum envelope 18 by a gas-tight ground plate or lens 20, having a centrally located aperture 22 (diameter 0.150 in.) containing a mechanically transparent and electrically opaque screen 24, of the type conventionally used in mass spectrometers, and which is electrically grounded. Vacuum envelope 18 is continuously evacuated through second diffusion pumping system 26 (e.g., a 180 liters/sec. capacity diffusion pump for a vacuum envelope having a volume of about 250 cc) which maintains the pressure within vacuum envelope 18 at about $4 \times 10^{-4}$ Torr.

Located within vacuum envelope 18 is a cross-axial electron-impact ionization (EI) source 30, having a ¼ in. diameter entrance aperture 32 containing an electrically opaque, mechanically transparent screen 34, a 0.150 in. diameter exit aperture 36, and a filament 38. EI source 30 is maintained at an electrical potential of +6 volts relative to ground plate 20 (this and all other illustrative potentials are relative to ground plate 20 unless otherwise specified). Illustratively, the solid walls 40 of EI source 30 are about 0.5 in. high, the spacing between apertures 32 and 36 is about 0.2 in., and the spacing between filament 38 and the center axis 42 between the apertures 32 and 36 is about 0.3 in.

Impeller screens 44,46 are stationed on each side of ionizer 30, CI impeller screen 44 being located about 0.1 in. from aperture 32 and EI impeller screen 46 being located about one-sixteenth in. from aperture 36 and one-sixteenth in. from ground lens 20. Each impeller screen 44, 46 is circular (about 0.15 in. in diameter) and is made of 45 × 0.001 in. wires per inch mesh, so as to be electrically opaque and mechanically transparent. The screens 44, 46 are maintained at a potential of −10 volts relative to ground plate 20 by a suitable power supply (not shown).

Chemical ionization (CI) source 50 has a gas-tight enclosure 52 (at a potential of +6 volts relative to ground plate 20), having a 0.2 in. diameter entrance aperture 54, and a 14 mil. diameter exit aperture 56, the axes of apertures 54 and 56 being perpendicular to one another. A 12 mil. diameter electron aperture 58 is required to expose the CI filament 60—e.g., a 20 mil. wide X 1 mil. thick X ¼ in. long rhenium filament maintained at −250 v (supplied by a suitable power source, not shown) with respect to the enclosure 52. The pressure inside enclosure 52 is about ½ Torr, the apertures 56 and 58, and the second pumping system 26 being selected to maintain a pressure of $4 \times 10^{-4}$ Torr in the envelope 18 despite the several orders of magnitude greater pressure in enclosure 52. The aperture 58, in lieu of being located as shown, might also be perpendicular to the other apertures (i.e., in the "top" of the CI source as shown in FIG. 1). In general, it is preferred, for adequate sample mixing in the CI source, that no two of the apertures be arranged in "line of sight" of one another. The aperture 58 is required only because of filament 60, and gases exiting this aperture will, in general, be pumped out by pumping system 26 and will not proceed to the EI source.

A circular repeller plate 62 (about 0.375 in. in diameter) is located within enclosure 52 and is maintained at a potential of +10 volts (with respect to the potential applied to enclosure 52) by a suitable power supply (not shown).

Component pieces (e.g., the CI and EI ionizers 50 and 30, and impeller screens 44, 46) may be formed out of the usual chemically resistant, electroconductive structural materials such as stainless steel (304. e.g.), nickel, and the like.

The aperture 54 is in communication, through a suitable conduit 64, with a gas chromatograph, indicated generally at 70, to receive the effluent of the chromatograph (the effluent typically exits the chromatograph at a pressure of about 2 Torr). A selector switch 80 is provided so that either only a selected one of filaments 38 and 60, or both filaments simultaneously may be energized.

In operation, the gaseous effluents exiting gas chromatograph 70 (including the reactant gas and the gaseous substance to be analyzed) are drawn first into CI source 50. Because the reactant gas pressure in CI course 50 is relatively high, energization of CI filament 60 produces the reactant ions which in turn react with and chemically ionize the gaseous substances to be analyzed entering the CI enclosure 52. The resultant ions exit through aperture 56 into the lower pressure vacuum envelope 18. To avoid fanning out and consequent dissipation of these ions as they enter the low pressure envelope region, the CI impeller screen 44, at −10 volts, is provided adjacent the aperture 56. This impeller screen, together with repeller plate 62 (at +10 volts), impels the exiting positive ions on from the CI source 50, on their path to the mass spectrometer, through the screen 44 and the screen 34 at the entrance of the EI source 30 and into the EI source. If EI filament 38 is also energized, the neutral gaseous substances entering EI source 30 will be subjected therein to electron-impact ionization. The EI impeller screen 46 (at −10 volts) impels ions from the +6 volts EI source 30 to and through the screen 24 in ground plate 20, into the filter region 12 of mass spectrometer 10. Again, EI impeller screen 46 tends to prevent dissipation of the ionized gases exiting the EI source and impels them into the analyzer system, to provide for maximum sensitivity.

The remaining mass spectral analysis proceeds conventionally in the mass spectrometer, with the resultant spectrum recorded, e.g., in the conventional manner with a recording oscillograph.

The selector switch 80 allows this system to be used in one of four distinct modes: Chemical ionization (by energizing CI filament 60 along); electron-impact ionization (by energizing EI filament 38 alone); superimposed chemical and electron-impact ionization (by energizing both filaments 38, 60 simultaneously); and, alternating chemical and electron-impact ionization (by alternatively energizing filaments 38 and 60). Thus correspondingly, depending on the chosen mode of operation of the system, the following spectra of, e.g.. the effluent of a gas chromatography column, are obtainable: CI mass spectra; EI mass spectra; simultaneous CI and EI mass spectra of a single sample both chemically and electron-impact ionized; and, separate CI and EI mass spectra closely alternating at short time intervals.

The advantages over the prior systems are apparent. First, one may obtain conventional CI and EI mass spectra from the very same ionization enclosure without the need for any special valving, splitters or separators, and without sacrificing sensitivity in either CI or EI modes, by the simple expedient of selectively energizing the appropriate filament. The dual capacity is achieved in a simple and hence reliable, and yet a versatile fashion.

Moreover, the two source system herein described provides a new analytical tool, not heretofore available—the simultaneous—i.e., superimposed, —CI–EI mass spectrum, with both the CI and EI peaks emerging with analytically significant sensitivity.

Figure 2:
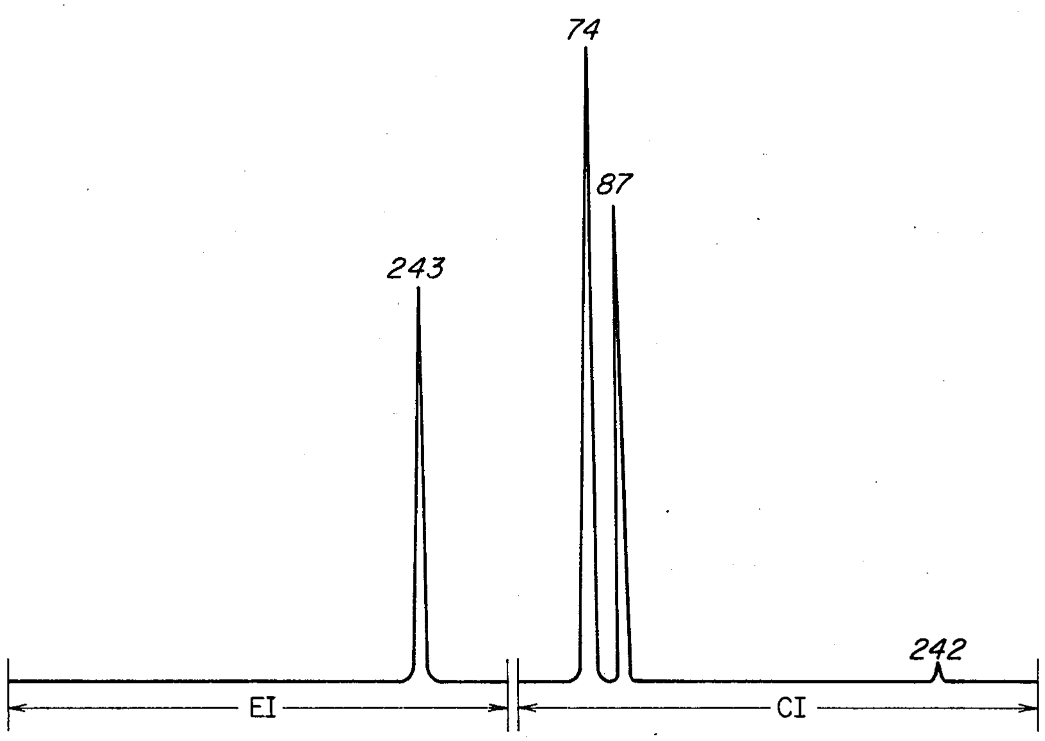
FIG. 2 is a diagrammatic representation of alternating CI and EI spectra obtained by utilizing the present invention; and, FIG. 3 is a diagrammatic representation of a simultaneous CI–EI mass spectra obtained by utilizing the present invention.

Finally, but by no means least important, is the alternating CI–EI spectra. A mixture is separated, by gas chromatography, into components which emerge from the column at time intervals determined by the speed at which components traverse the gas chromatographic column. The elapsed time during which a separated component appears in the gas chromatographic effluent in an analytically significant amount is short—say, about 15 seconds at half height. Thus, whereas with prior systems repeated switchover from chemical ionization to electron-impact ionization and so, even if possible without interrupting the flow characteristics of the effluent stream, could not be accomplished effectively within this time interval, with the present system, as indicated in FIG. 2, alternating CI and EI spectra can be obtained at a 3 second separation, well within the time interval during which a single component emerges in the effluent. Since variables relating to the flow rate, temperature, pressure, and the like of the emerging component will be substantially constant during the time required to record both spectra, the spectra are easy to correlate and analyze.

The system thus produces conventional CI and EI spectra, the CI pressure and EI pressures used being those conventionally used to obtain such spectra. For instance, a presently preferred pressure in the CI source 50 is at least $10^{-1}$ Torr and more preferably about 0.5 Torr; and a presently preferred pressure in the EI source 30 is at most about $4 \times 10^{-4}$ Torr. The sizes of envelope 18 and CI enclosure 52 as well as CI apertures 54, 56 and 58, and other variables such as flow rate through the gas chromatographic column or the capacity and pumping speed of pumping system 26, may be selected in accordance with well-known vacuum techniques to provide the appropriate pressures in the ionization sources. In general, a preferred size for aperture 56 is about 18 to 1,800 $mil^2$.

Although in the preferred embodiment, a quadrupole filter mass spectrometer is illustrated, it is contemplated that applicant's two source (CI and EI) system is useful in providing ionized species for mass spectrometers using different analyzers for separating ions according to their mass-to-charge ratios.

The energy of the ionizing electrons are those customarily used for chemical and electron-impact ionization. 70 eV is a presently standardized EI energy level (generally, 50 to 100 eV is a desired range). In general, about 100 to 500 eV is utilized for chemical ionization.

The precise value of the potential at the EI source 30 and the CI source 50 may be varied. When the system is operated in the simultaneous mode so that the ions formed in the chemical ionization zone will proceed on to the mass spectrometer, the value of these potentials must be, for positive ions, less positive in the CI - to - EI - to - mass spectrometer direction so as to cause ion flow into the mass spectrometer. The additional negative potential source at impeller screen 44 is particularly useful with a relatively open EI source as shown to minimize ion dissipation between the CI source and the mass spectrometer.

Figure 3:
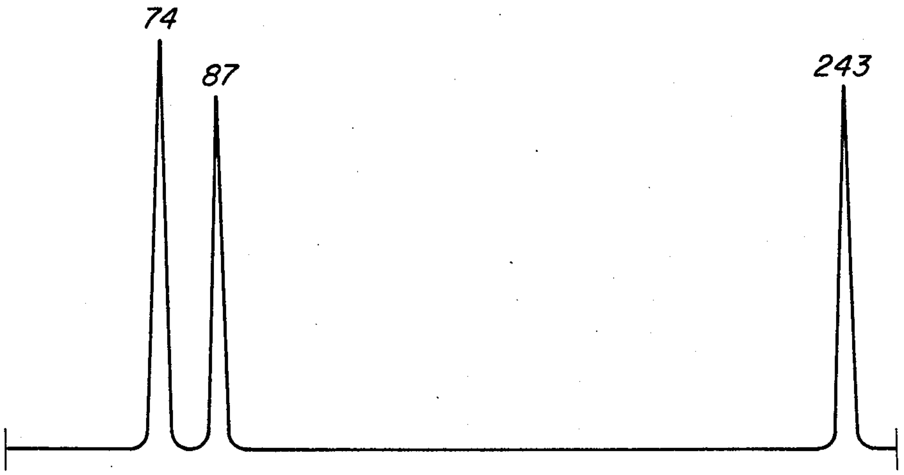

FIGS. 2 and 3 illustrate the spectra obtainable utilizing this invention. The sample was injected, 1 microgram of methyl myristate, $CH_3(CH_2)_{12}COOCH_3$, in hexane solution, onto a 50 ft. × 0.020 in. OV–17 support-coated open tubular gas chromatography column (purchased from Perkin-Elmer, Norwalk, Connecticut). The temperature of the column was programmed from 100° C at 8° per minute, and the flow rate of the methane carrier-reactant gas into the evenlope 18 was less than 4 ml. per min.

Alternating EI and CI mass spectra, covering an m/e range of about 40 to 285 amu, each of three seconds duration with a three second interval between them, are shown as diagrammatic representations of actual oscillographic recordings in FIG. 2. Additional alternating spectra may be obtained by continuing to switch back and forth, depending on the width of the gas chromatography peak.

FIG. 3 is a diagrammatic representation of an actual oscillographic recording of the simultaneous EI–CI mass spectrum of the same compound (but of a subsequent injection), scanned again over the mass range of about 40 to 285 amu in 3 seconds. Both the EI and CI filaments were energized at the same time to provide this spectrum. But for some minor variations in additivity due to continuous changes in sample concentration in the ion sources while spectra are recorded because the sample is introduced via a gas chromatograph, the simultaneous spectrum of FIG. 3 is equivalent to superimposition of the EI and CI spectra of FIG. 2.

The abundant peak at m/e 243 in the CI mass spectrum (FIG. 2) is due to protonated methyl myristate $(C_{15}H_{31}O_2)^+$ and is a clear indication of the molecular weight (242) of the sample; on the other hand the molecular ion of the sample at m/e 242 in the EI mass spectrum (FIG. 2) is of rather low relative abundance. However abundant fragment peaks bearing primary structural information appear in the EI mass spectrum at e.g. m/e 74 and 87 and are absent from the CI spectrum. Thus the two mass spectra are complementary. The simultaneous EI–CI mass spectrum (FIG. 3) combines the best features of each spectrum and shows in high abundance the fragments (m/e 74, 87) bearing structural information as well as the peak (m/e 243) needed for molecular weight assignment.

Other embodiments will occur to those skilled in the art and are within the following claims.

What is claimed is:

1. Apparatus for ionizing substances, comprising a reactant gas and a substance to be analyzed, for analysis in a mass spectrometer comprising:

a first ionization zone constructed to contain said gaseous substances therein at a chemical ionization pressure and comprising first ionizing means for ionizing said substance to be analyzed in said zone;

a second separate ionization zone constructed to contain said gaseous substances therein at an electron-impact ionization pressure below the pressure in said first ionization zone and comprising second ionizing means comprising a source of electrons for ionizing said substance to be analyzed in said second ionization zone;

an aperture between said first and second ionization zones sufficiently small to provide a pressure drop between said zones;

flow directing means for directing neutral gaseous substances in a path sequentially through said first and second ionization zones; and means for directing and impelling ionized substances in a path to said mass spectrometer.

2. Apparatus according to claim 1 for analyzing the gaseous effluent of a gas chromatograph including conduit means between said chromatograph and said first ionization zone.

3. Apparatus according to claim 1 including a second aperture for said gaseous substances between said second ionization zone and said mass spectrometer, wherein said second aperture is larger than said aperture between said first ionization zone and said second ionization zone.

4. Apparatus according to claim 1 wherein said means for directing and impelling said ionized substances to said mass spectrometer comprises sources of electrical potential selected to provide a potential impelling said ions from said ionization zones to said mass spectrometer.

5. Apparatus according to claim 4 wherein said sources of electrical potential include potential sources providing a greater impelling potential for said ion at said first ionization zone than at said second ionization zone to impel ions from said first zone into said second zone on the path to said mass spectrometer.

6. Apparatus according to claim 5 including an additional potential source between said zones, said additional source providing a greater impelling potential than the potential at either of said zones, and of sufficiently greater impelling potential than the impelling potential at said first zone to impel ions formed in said first zone from said first zone past said additional potential source into said second zone on their path towards mass spectrometer.

7. Apparatus according to claim 6 wherein said additional source is an electroconductive ion-permeable screen arranged in the path between said first zone and said second zone.

8. Apparatus according to claim 6 including a second additional potential source between said second ionization zone and the ground plate of said mass spectrometer, said second additional potential source being of greater impelling potential than the potential source at said second ionization zone and the potential source at the ground plate of said mass spectrometer to impel ions from said second ionization zone to said mass spectrometer.

9. Apparatus according to claim 8 wherein said second additional potential source is an electroconductive ion-permeable screen arranged in the path between said second ionization zone and said mass spectrometer.

10. Apparatus according to claim 5 wherein said ionized substances are positive ions, and the potential at said second ionization zone is negative with respect to the potential at said first ionization zone to impel said ions from said first zone to said second zone.

11. Apparatus according to claim 1 wherein said mass spectrometer is of the type having a quadrupole mass filter for separating ions therein.

12. Apparatus according to claim 1 wherein said ionizing means at said first ionization zone comprises a source of electrons.

13. Apparatus according to claim 1 wherein said second ionization zone comprises a gaseous substance entrance substantially aligned with the exit from said first ionization zone, and a gaseous substance exit substantially aligned with the entrance to said second ionization zone, the electron source for said second ionization zone being located midway between said entrance and said exit.

14. Apparatus according to claim 1 further including switching means for selectively energizing only said first ionizing means, only said second ionizing means, or both of said ionizing means to ionize said substance to be analyzed only in said first ionization zone, only in said second ionization zone, or in both of said ionization zones, respectively.

15. Apparatus according to claim 1 wherein said chemical ionization pressure is at least $10^{-1}$ Torr.

16. A method for analyzing a gaseous substance comprising the steps of:

chemically ionizing said substance in a chemical ionization zone at a chemical ionization pressure;

passing the product of said chemical ionization zone into an electron-impact ionization zone maintained at an electron-impact ionization pressure through an aperture sufficiently small to maintain a pressure drop between said zones;

subjecting said product to electron-impact ionization in said electron-impact ionization zone; and obtaining the mass spectrum of the ionized substances formed.

17. The method of claim 16 comprising alternately obtaining a first mass spectra of ionized substances formed in said chemical ionization zone and a second mass spectra of ionized substances formed in said electron-impact ionization zone by alternately energizing said zones, wherein said first spectra and said second spectra are both obtained with a total elapsed time of about 30 second.

18. A method according to claim 17 including the previous steps of separating said gaseous substance into components in a gas chromatograph and passing the effluent containing said components from said chromatograph to said chemical ionization zone, and wherein said two mass spectra are both obtained within the time width at half-height of a peak component of said effluent.

19. A method according to claim 16 including the steps of energizing both of said ionization zones during passage therethrough of said gaseous substance so as to obtain a mass spectrum simultaneously indicative both of chemical ionization and of electron-impact ionization of said substance.

* * * * *

UNITED STATES PATENT OFFICE
CERTIFICATE OF CORRECTION

Patent No. 3,984,692 Dated October 5, 1976

Inventor(s) Guy P. Arsenault

It is certified that error appears in the above-identified patent and that said Letters Patent are hereby corrected as shown below:

In the ABSTRACT, line 6: change "EI-EI" to -- CI-EI --;

In Figure 2 interchange the abbreviations "CI"and"EI";

Column 1, line 41: change "1971" to -- 1972 --;

Column 1, line 51: delete the word "region";

Column 2, line 7: change "Lower" to -- lower --;

Column 4, line 47: replace the period after "304" by a comma;

Column 4, line 61: change "course" to -- source --;

Column 5, line 23: change "along" to -- alone --;

Column 5, line 30: change "e.g.." to -- e.g., --;

Column 5, line 60: after "so", insert -- on --;

Column 6, line 52: change "evenlope" to -- envelope --.

UNITED STATES PATENT AND TRADEMARK OFFICE

CERTIFICATE OF CORRECTION

PATENT NO. : 3,984,692

DATED : October 5, 1976

INVENTOR(S) : Guy P. Arsenault

It is certified that error appears in the above-identified patent and that said Letters Patent are hereby corrected as shown below:

Column 10, after line 13, add the following claims:

20. A dual mode ion source for permitting the selective operation of a mass spectrometer in a chemical ionization mode and an electron impact ionization mode, said apparatus comprising:

input means for admitting gasiform materials into at least one ionization region, electron generating means for generating at least one electron beam and for projecting electrons into said ionization region;

said electron generating means including;

dual mode means for selectively providing a relatively large electron entrance aperture for facilitating electron impact ionization of said gasiform material and for selectively providing a relatively small electron entrance aperture for facilitating the high pressures needed to effect chemical ionization reactions in said gasiform material; and

UNITED STATES PATENT OFFICE
CERTIFICATE OF CORRECTION

Patent No. 3,984,692 Dated October 5, 1976

Inventor(s) Guy P. Arsenault

It is certified that error appears in the above-identified patent and that said Letters Patent are hereby corrected as shown below:

selection means for selectively activating said dual mode means to operate the source in an electron impact mode or chemical ionization mode respectively.

21. A dual mode source as in claim 20 wherein:

said dual mode means comprises first electron filament means for generating a first electron beam having a relatively large number of electrons passing into a relatively low pressure gas, and a second electron filament means for generating a second electron beam passing through a relatively high pressure gas, and said selection means comprises electrical switching means for selectively electrically activating either said first electron filament means or said second electron filament means.

UNITED STATES PATENT OFFICE
CERTIFICATE OF CORRECTION

Patent No. 3,984,692 Dated October 5, 1976

Inventor(s) Guy F. Arsenault

It is certified that error appears in the above-identified patent and that said Letters Patent are hereby corrected as shown below:

22. A dual mode ion source as in claim 21 wherein:

said input means includes a first region normally maintained at very low pressures and a second substantially closed region for containing said gasiform materials at higher pressures for facilitating chemical ionization ion-molecule reactions with the input gasiform materials normally passing from said second region to said first region, said first electron filament means being disposed to direct said first electron beam into said first region, and said second electron filament means being disposed to direct said second electron beam into said second region.

UNITED STATES PATENT OFFICE

CERTIFICATE OF CORRECTION

Patent No. 3,984,692 Dated October 5, 1976

Inventor(s) Guy P. Arsenault

It is certified that error appears in the above-identified patent and that said Letters Patent are hereby corrected as shown below:

23. A dual mode ion source as in claim 22 wherein:

said first and second regions are separated by an aperture with said gasiform material flowing first into said second region and from there into said first region.

24. A dual mode ion source for a mass spectrometer selectively ionizing gaseous material in a chemical ionization mode or an electron impact ionization mode, the apparatus comprising:

input means for admitting gaseous materials into an ionization region, electron generating means for generating at least one electron beam and for projecting at least one flow of electrons into said ionization region, and dual mode means selectively operable to provide a relatively large aperture and large flow of electrons thereby facilitating

UNITED STATES PATENT OFFICE
CERTIFICATE OF CORRECTION

Patent No. 3,984,692 Dated October 5, 1976

Inventor(s) Guy P. Arsenault

It is certified that error appears in the above-identified patent and that said Letters Patent are hereby corrected as shown below:

electron impact ionization of said gaseous material or a relatively small aperture and small flow of electrons thereby facilitating the high pressures needed to effect chemical ionization reactions in said gaseous material.

Signed and Sealed this

Seventeenth Day of May 1977

[SEAL]

*Attest:*

RUTH C. MASON
*Attesting Officer*

C. MARSHALL DANN
*Commissioner of Patents and Trademarks*